United States Patent
Mistretta

(10) Patent No.: US 6,671,536 B2
(45) Date of Patent: Dec. 30, 2003

(54) MAGNETIC RESONANCE ANGIOGRAPHY USING FLOATING TABLE PROJECTION IMAGING

(75) Inventor: Charles A. Mistretta, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 87 days.

(21) Appl. No.: 09/962,890

(22) Filed: Sep. 25, 2001

(65) Prior Publication Data

US 2003/0060698 A1 Mar. 27, 2003

(51) Int. Cl.[7] .............................................. A61B 5/055
(52) U.S. Cl. ...................... 600/410; 600/419; 600/420; 128/898; 128/922; 382/128; 382/130; 382/276; 382/280; 324/306; 324/307; 324/309
(58) Field of Search ................................. 362/128, 130, 362/232, 280, 276, 278; 128/898, 922; 600/410, 419, 420, 416; 702/106; 324/306, 307, 309

(56) References Cited

U.S. PATENT DOCUMENTS

| | | | | |
|---|---|---|---|---|
| 4,587,489 A | * | 5/1986 | Wehrli | 324/309 |
| 4,665,365 A | * | 5/1987 | Glover et al. | 324/309 |
| 4,716,368 A | * | 12/1987 | Haacke | 324/308 |
| 5,086,275 A | * | 2/1992 | Roemer | 324/309 |
| 5,349,294 A | * | 9/1994 | Kasuboski | 324/309 |
| 5,636,636 A | | 6/1997 | Kuhn et al. | |
| 5,924,987 A | * | 7/1999 | Meaney et al. | 324/306 |
| 5,928,148 A | | 7/1999 | Wang et al. | |
| 6,385,478 B1 | | 5/2002 | Hajnal | |
| 6,445,181 B1 | | 9/2002 | Pelc et al. | |
| 6,487,435 B2 | * | 11/2002 | Mistretta et al. | 600/420 |

FOREIGN PATENT DOCUMENTS

| | | |
|---|---|---|
| EP | 0 642 031 A1 | 8/1994 |
| EP | 1 024 371 A2 | 8/2000 |
| GB | 2 101 327 | 1/1983 |

OTHER PUBLICATIONS

Dennis L. Parker, Ph.D. et al, Journal of Magnetic Resonance Imaging, vol. 10 (1999), pp. 569–575, "Magnetic Resonance Angiography With Sliding Interleaved Projection Reconstruction (SLIPR) Acquisition".

Jorg Barkhausen, M.D., et al., Radiology, vol. 220 (2001), pp. 252–256, "Whole–Body MR Imaging in 30 Seconds with Real–Time True FISP and a Continuously Rolling Table Platform: Feasibility Study".

* cited by examiner

Primary Examiner—Marvin M. Lateef
Assistant Examiner—Jeoyuh Lin
(74) Attorney, Agent, or Firm—Quarles & Brady, LLP

(57) ABSTRACT

A 3D projection reconstruction pulse sequence is employed to acquire CEMRA data as the subject is continuously moved through the field of view of the MRI system. The acquired k-space data is phase corrected to offset the table motion and the corrected data is used to reconstruct an image over a field of view that far exceeds the size of the MRI system field of view. In one embodiment the image is formed as a set of anatomic subregion images which are concatenated to form a single image and in another embodiment a series of images of each anatomic subregion are produced to depict the dynamic inflow of contrast agent.

20 Claims, 8 Drawing Sheets

MAGNETIC RESONANCE ANGIOGRAPHY USING FLOATING TABLE PROJECTION IMAGING

BACKGROUND OF THE INVENTION

The field of the invention is magnetic resonance imaging ("MRI"), and particularly, studies which extend over a field of view which is larger than the static field of view of the MRI system. One such study is magnetic resonance angiography of human vasculature using contrast agents.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. Each measurement is referred to in the art as a "view" and the number of views determines the resolution of the image. The resulting set of received NMR signals, or views, or k-space samples, are digitized and processed to reconstruct the image using one of many well known reconstruction techniques. With conventional techniques, the total scan time is determined in part by the number of measurement cycles, or views, that are acquired for an image, and therefore, scan time can be reduced at the expense of image resolution by reducing the number of acquired views.

The most prevalent method for acquiring an NMR data set from which an image can be reconstructed is referred to as the "Fourier transform" imaging technique or "spin-warp" technique. This technique is discussed in an article entitled "Spin-Warp NMR Imaging and Applications to Human Whole-Body Imaging", by W. A. Edelstein et al., *Physics in Medicine and Biology*, Vol. 25, p. 751–756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan. In a three-dimensional implementation (3DFT) a third gradient ($G_z$) is applied before each signal readout to phase encode along the third axis. The magnitude of this second phase encoding gradient pulse $G_z$ is also stepped through values during the scan. These 2DFT and 3DFT methods sample k-space in a rectilinear pattern.

To enhance the diagnostic capability of MRA a contrast agent such as gadolinium can be injected into the patient prior to the MRA scan. As described in U.S. Pat. No. 5,417,213 the trick with this contrast enhanced (CE) MRA method is to acquire the central k-space views at the moment the bolus of contrast agent is flowing through the vasculature of interest. Collection of the central lines of k-space during peak arterial enhancement is key to the success of a CEMRA exam. If the central lines of k-space are acquired prior to the arrival of contrast, severe image artifacts can limit the diagnostic information in the image. Alternatively, arterial images acquired after the passage of the peak arterial contrast are sometimes obscured by the enhancement of veins. In many anatomic regions, such as the carotid or renal arteries, the separation between arterial and venous enhancement can be as short as 6 seconds.

As indicated above, the acquisition of MRA data is timed such that the central region of k-space is acquired as the bolus of contrast agent arrives in the arteries of interest. The ability to time the arrival of contrast varies considerably and it is helpful in many applications to acquire a series of MRA images in what is referred to as a dynamic study which depicts the separate enhancement of arteries and veins. The temporal series of images from such a dynamic study is also useful for observing delayed vessel filling patterns caused by disease. This requirement has been partially addressed by acquiring a series of time resolved images using a 3D "Fourier" acquisition as described by Korosec F., Frayne R, Grist T., Mistretta C., "Time-Resolved Contrast-Enhanced 3D MR Angiography", *Magn. Reson. Med.* 1996; 36:345–351 and in U.S. Pat. No. 5,713,358. However, with this method, the increased sampling rate of the center of k-space reduces the spatial resolution of the individual images in the time resolved series to about 75% of the resolution obtained when a single timed image is acquired during the passage of contrast.

There has been recent work using projection reconstruction methods for acquiring MRA data. Projection reconstruction methods have been known since the inception of magnetic resonance imaging. Rather than sampling k-space in a rectilinear scan pattern as is done in Fourier imaging and shown in FIG. 2, projection reconstruction methods sample k-space with a series of views that sample radial lines extending outward from the center of k-space as shown in FIG. 3. The number of views needed to sample k-space determines the length of the scan and if an insufficient number of views are acquired, streak artifacts are produced in the reconstructed image.

Efforts have been made to acquire CEMRA images in shorter scan times using undersampled projection reconstruction scanning methods. A method for reducing the number of projections in a 3D acquisition by a factor of two has been reported by F. Boada, J. Christensen, J. Gillen, and K. Thulborn, "Three-Dimensional Projection Imaging With Half The Number Of Projections", *MRM* 37:470–477 (1997). Other methods are described in co-pending U.S. patent application Ser. No. 09/767,757 filed on Jan. 23, 2001 and entitled "Magnetic Resonance Angiography Using Undersampled 3D Projection Imaging".

The non-invasiveness of MRA makes it a valuable screening tool for cardiovascular diseases. Screening typically requires imaging vessels in a large volume. This is particularly true for diseases in the runoff vessels of the lower extremity. The field of view (FOV) in MR imaging is limited by the volume of the $B_0$ field homogeneity and the receiver coil size (typically, the FOV<48 cm on current commercial MR scanners). The anatomic region of interest in the lower extremity, for example, is about 100 cm and this requires several scanner FOVs, or stations, for a complete study. This requires that the patient be repositioned inside the bore of the magnet, the patient be re-landmarked, scout images be acquired and a preparation scan be performed for each FOV. All of these additional steps take time and, therefore, are expensive. When contrast enhanced MRA is performed, the repositioning also necessitates additional contrast injections.

Recently gadolinium-enhanced bolus chase techniques have been reported which overcome this difficulty, K. Y. Ho, T. Leiner, M. H. de Hann, J. M. A. van Engleshoven, "Gadolinium optimized tracking technique: a new MRA technique for imaging the peripheral vascular tree from aorta to the foot using one bolus of gadolinium (abs)." *Proc. 5th Meeting of ISMRM,* p203, 1997. As described in U.S. Pat. Nos. 5,924,987 and 5,928,148, MRA data is acquired from a large field of view by automatically moving the patient table to a plurality of different locations during the scan and acquiring an image at each station. The movement of the table may be timed to follow the contrast bolus through the vasculature so that peak contrast is achieved at each station.

Prior moving table methods attempt to keep up with the contrast bolus as it moves through the vasculature by quickly moving to each successive station, stopping to acquire an image, and then moving to the next station. The resulting plurality of acquired images are then stitched together to form a single image. Typically, however, this stop-and-go imaging does not keep up with the moving bolus and images acquired near the end of the examination are not acquired under optimal contrast enhancement conditions.

While the present invention has particular clinical application to CEMRA, other studies in which image data is acquired over an extended field of view are known and present similar problems. As disclosed by Barkhousen, et al in "Whole Body MR Imaging In 30 Seconds With Real Time True Fisp and A Continuously Rolling Table Platform: Feasibility Study," *Radiology* 2001:220:252–256 a human subject may be scanned over an extended field of view to locate tumors by moving the table.

SUMMARY OF THE INVENTION

The present invention is an improved MRI or MRA method which employs a projection reconstruction acquisition to continuously acquire k-space data as a subject is moved through the field of view (FOV) of an MRI system. Subregions in the subject along the direction of motion and the associated k-space data acquired while each subregion is within the MRI system FOV is phase corrected to a reference position, and an image is reconstructed for each subregion using the associated phase corrected k-space data.

A general object of the invention is to acquire a high resolution image with a MRI system by continuously moving the subject through the static field of view of the MRI system. The continuously acquired data is divided into sections and the views in each section are phase corrected to offset the effects of table motion. Subregions in the subject are depicted in the images reconstructed from the phase corrected sections of acquired data.

An object of the invention is to produce a CEMRA image which is acquired under optimal conditions as a contrast bolus moves through a subject's vasculature. By continuously moving the patient table at substantially the same speed as the moving contrast bolus, k-space data is acquired at optimal contrast throughout the examination. No time is lost stopping and restarting table motion and higher resolution data may be acquired by performing a projection reconstruction acquisition.

Yet another object of the invention is to obtain higher time and spatial resolution images while tracking a contrast bolus through a subject's vasculature. By using a projection reconstruction method for acquiring image data, a higher time resolution can be achieved without significantly sacrificing image quality. This enables reconstruction of CEMRA images with optimal contrast enhancement in each subregion.

Another object of the invention is to produce an image of prescribed FOV which is substantially larger than the MRI system FOV. The prescribed FOV in the subject is moved through the MRI system FOV and the resulting subregion images are concatenated to form a single image that spans the prescribed FOV.

Yet another aspect of the invention is to provide a temporal series of images of each anatomic subregion to study the dynamics of contrast flow within the subregion. This is achieved by acquiring the k-space data for each anatomic subregion as interleaved subsets of projection views and reconstructing an image from each interleave.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 4:
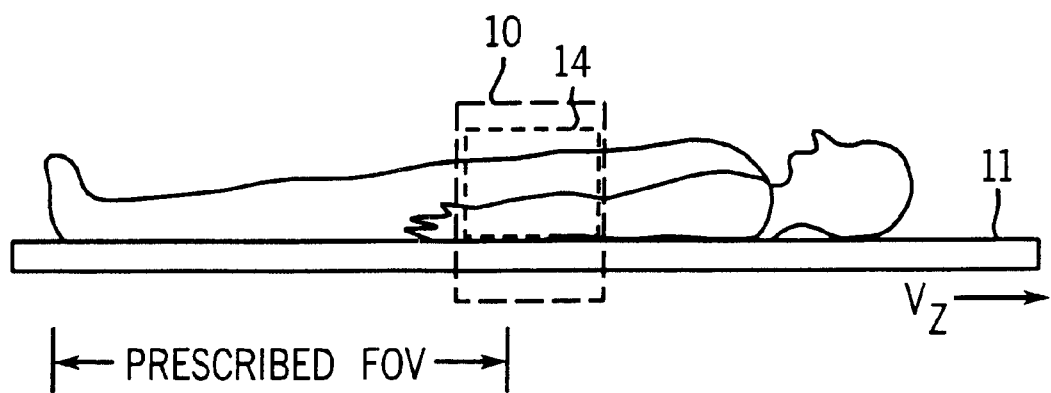
FIG. 4 is a pictorial representation of a subject being scanned in the MRI system of FIG. 1.

The present invention enables a subject to be imaged over a prescribed field of view (FOV) which can be many times larger than the static FOV of the MRI system being used. Referring to FIG. 4, the present invention addresses the problem in which a CEMRA image is acquired over a prescribed FOV which is larger than a scanner FOV indicated by dashed lines 10. The size of the scanner FOV 10 depends on the particular MRI system being used, and may be, for example, from 20 to 50 cm in length along the table axis z. A prescribed FOV for a CEMRA of the lower extremities may range, for example, from 30 to 150 cm, and to acquire k-space NMR data from this large FOV, the patient must be moved.

Figure 6:
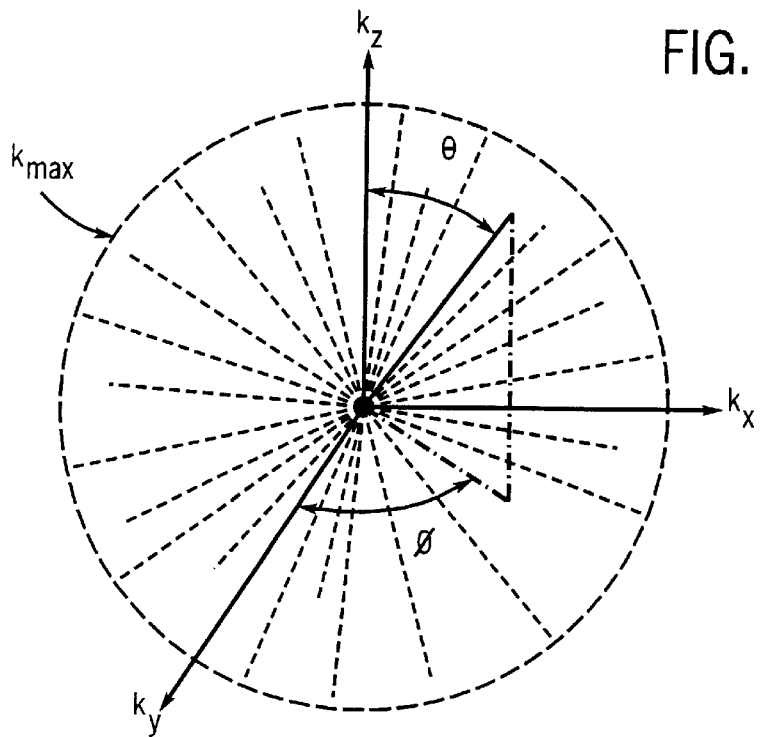
FIG. 6 is a graphic illustration of the angles that define scan parameters relative to a three-dimensional (3D) projection within an acquisition.

To practice a preferred embodiment of the invention NMR data is acquired in a 3D spherical k-space coordinate system, with the readout gradient direction defined by the angle $\theta$ from the $k_z$-axis and by the angle $\phi$ from the $k_y$-axis, as shown in FIG. 6. The sampling method consists of a series of evenly spaced projections with all projections going through the center of k-space. The maximum k-space radius value ($k_{max}$) determines the resolution in all three spatial directions of the resulting image. The radial sample spacing ($\Delta k_r$) determines the diameter (D) of the full field of view (FOV) of the reconstructed image at any point in time. The full FOV image may be reconstructed without artifacts if the Nyquist condition is met, $\Delta k_\theta$, $\Delta k_\phi \leq \Delta k_r$. If this condition is not satisfied, however, alias-free reconstruction still occurs within a reduced diameter (d) that is less than the full FOV (D). If it is assumed that the projections are acquired evenly spaced ($\Delta k_\theta = \Delta k_\phi = \Delta k_r$), then the surface area A at $k_{max}$ associated with a projection is $$A = \Delta k^2 = \frac{2\pi}{N_p} k_{max}^2 \quad (2)$$

where $N_p$ is the number of acquired views, or projections. Equation (2) determines $\Delta k$, by which the diameter (d) of the reduced FOV due to the angular spacing can be related to the full FOV diameter D as follows:

$$\frac{d}{D} = \frac{2}{N_R} \sqrt{\frac{N_P}{2\pi}}$$

where $N_R$ is the matrix size (i.e. number of acquired samples during the signal readout) across the FOV. In the image reconstructed from this k-space data, a well-constructed reduced FOV appears centered around each object in the image even if the Nyquist condition is not met. However, radial streak artifacts from outside can enter the local FOV. The condition that k-space be fully sampled across the entire FOV, or d=D, requires that the number of sampled projections be:

$$N_p = \frac{\pi}{2} N_R^2. \quad (3)$$

If $N_R$=256 samples are acquired during the readout of each acquired NMR signal, for example, the number of projection views $N_p$ required to fully meet the Nyquist condition is around 103,000. Fortunately, the image artifacts produced by undersampling are not clinically significant in most applications and the number of projection views can be significantly reduced below this Nyquist number. We have found that clinically useful images can be produced with as few as 1000 repetitions of a 3DPR pulse sequence.

The present invention employs a projection reconstruction ("PR") pulse sequence which is continuously performed as the patient is continuously moved through the scanner FOV 10 to acquire k-space NMR data throughout the prescribed FOV. In the preferred embodiment described below a 3DPR pulse sequence is used in which a radial line of k-space samples is acquired during each TR, and the imaging gradients are stepped through a set of values during successive repetitions to sample throughout a spherical volume of k-space as shown in FIG. 6. When the spherical volume of k-space has been sampled, the cycle repeats to sample another spherical k-space volume. This cycle continues during the entire scan to produce one continuous set of k-space data.

The imaged subject is divided into subregions. Sufficient k-space sampling must be done while a subregion within the subject is in the scanner FOV 10 to produce an image of the prescribed resolution without significant image artifacts. For every such subregion there is a corresponding set of k-space data referred to herein as a "section" and each such section of k-space data is processed as described below to produce an image of its corresponding subregion.

The table 11 is moved at a constant velocity $V_z$ during the acquisition of a series of sections of k-space data. This process continues until the entire prescribed FOV has moved through the scanner FOV 10. The table is moved at a rate $V_z$ such that spins in each anatomical subregion remain in the scanner FOV 10 during the acquisition of a preselected number of projections (i.e., a k-space section). The number of projections acquired for each anatomical subregion (i.e., the size of a section) is chosen based on the degree of angular undersampling artifacts that can be accepted for the particular clinical application. If a contrast agent is injected, the table velocity $V_z$ is usually selected to match the rate at which the contrast bolus traverses the prescribed field of view. In this case the maximum number of views N for a complete section of k-space NMR data is set such that all views are acquired while the subregion spins are in the scanner FOV.

Because of the table movement during the acquisition of the k-space data, phase corrections must be made to each k-space sample. The relationship between the gradients and the k-space sample position is given by $k_i = \gamma G_i t_R$ where i is x,y, or z and $t_R$ is the time during the readout. A signal sample acquired with a subject at location z can be expressed as follows:

$$S_z(t_R) \propto \int dx\,dy\,dz\, D(x,y,z) exp(i[k_x x + k_y y + k_z z]).$$

Let us consider the x,y, and z coordinates to be fixed within the patient. Assume at some arbitrary position that the patient coordinate system and the scanner coordinate system x',y' and z' coincide. If the object is in motion in the z direction then an object at point z within the patient will be resituated at a point z'=z+$\Delta$z in the scanner reference frame and will be precessing with a different frequency due to being at a different position along the z axis gradient. The signal read during a projection readout at this new position will be $$S_{z+\Delta z}(t_R) \propto \int dx\,dy\,dz\, D(x,y,z) exp(i[k_x x + k_y y + k_z(z + \Delta z)]).$$

The k-space data acquired with the patient situated at location z+$\Delta$z can be converted to data that would have been acquired at the patient location z by the Fourier shift theorem. Namely $$S_z(t_R) = S_{z+\Delta z}(t_R) exp(-i\, k_z \Delta z) \quad (1)$$

Therefore, while the table is moving and the projection views are acquired for each section, the acquired k-space samples are phase corrected in accordance with equation (1) for the change in position within the z gradient. As will be described below, in the preferred embodiment the table position is recorded along with the NMR data acquired during each view acquisition. The value of $\Delta z$ for a particular view is, therefore, easily calculated by subtracting the recorded table position of a reference view from the recorded table position of the particular view.

After all of the k-space NMR data is phase corrected based on the z-axis position at the time of its acquisition, the data are regridded to form a 3D Cartesian array of k-space sample data. A subregion image may then be reconstructed in the usual manner by performing a three-dimensional Fourier transformation of its corresponding section of k-space data that was acquired while the subregion was within the static FOV of the MRI system. A series of subregion images from a succession of corresponding k-space sections is thus produced, and these can be concatenated to form one long image that covers the entire prescribed field of view. As will be described below, a series of time resolved images can also be produced for each subregion or selected ones of the subregion images may be concatenated.

If the velocity of the table matches the rate at which the bolus flows along the z axis, and the procedure is started as the bolus arrives, the above embodiment of the invention produces a single image with optimal contrast enhancement of the entire image vasculature.

Figure 5:
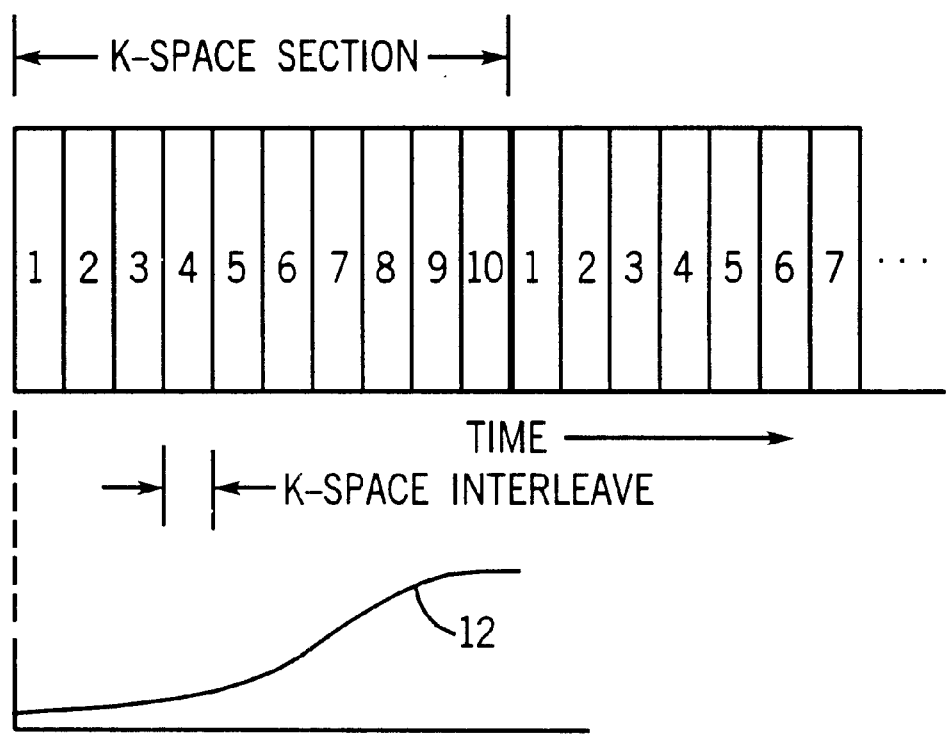
FIG. 5 is a graphic representation of the acquisition of NMR data as the subject in FIG. 4 is moved through the MRI system.

Another aspect of the present invention is the ability to acquire interleaved subsets of the complete section of k-space data acquired while the subregion is within the static FOV of the MRI system. These interleaved subsets enable a temporal series of images to be reconstructed to enable the study of the dynamics of contrast flow within the anatomic subregion. Referring particularly to FIG. 5, rather than acquiring the entire section of N k-space views in a monotonic order, the k-space section may be divided into interleaved sets of views. In the preferred embodiment described below, each section is divided into ten interleaves, and whereas the acquisition of the entire k-space section may require 30 seconds, the acquisition of each interleave requires only 3 seconds. If during this 30 seconds the contrast bolus enters the subregion corresponding to the k-space section, the contrast enhancement may change significantly. As illustrated in FIG. 5 by the contrast enhancement curve 12, the interleaves 1–4 acquired early in the 30 second interval may reveal little vascular contrast enhancement, whereas interleaves 8–10 may reveal substantial contrast enhancement. The interleave images can be displayed in sequence to study dynamic flow into the associated subregion.

While a subregion image may be reconstructed from any one of the ten k-space interleaves, image artifacts can be reduced by using peripheral k-space data from other k-space interleaves. Reference is made to FIG. 6 which illustrates the sampling patterns for three interleaves. In this example the N projection views required to fully sample the k-space spherical volume to a radius R are divided into three sets of interleaved projection views. The sampling trajectories of the first set of projection views are indicated by dotted lines 230, the second set is indicated by dashed lines 232, and the third set by lines 234. Because they are interleaved with the other sets and evenly spaced around the center of k-space, each set of projections 230, 232 and 234 acquire an image data set that is fully sampled at a smaller radius r. In other words, each set of interleaves 230, 232 and 234 fully samples the center region of k-space, but undersamples the peripheral region of k-space.

Referring again to FIG. 5, since image contrast in CEMRA is determined primarily by the central k-space data, a subregion image reconstructed from a selected one of the ten interleaves will accurately reveal this contrast because the center of k-space is fully sampled. It is a teaching of the present invention that artifacts produced by the undersampling of the peripheral regions of k-space can be significantly suppressed by using the peripheral k-space data from the remaining nine interleaves in the k-space section. This is done by first selecting the desired k-space interleave and establishing a reference time at one of the view acquisitions therein. Phase corrections are made to all the k-space data acquired during the k-space section using the above equation (1) and this selected reference time. The k-space data from all of the interleaves is combined with the central k-space data from the selected k-space interleave. As a result, the combined k-space data set is fully sampled to the outer radius R with data acquired over the entire 30 seconds, whereas the fully sampled central region is temporally focused on a short 3 second time interval. The combined k-space data set is then regridded as described above and Fourier transformed to form one CEMRA image of one subregion of the prescribed FOV.

This reconstruction method can be used to produce a dynamic study of each subregion. If ten interleaves are acquired while an anatomic subregion is in the static FOV, a series of ten times resolved images of that subregion can be produced. For each of these time resolved images the central k-space portion of the current interleave is combined with the peripheral k-space data from the remaining interleaves. There are a number of methods for combining this k-space data to take advantage of the fact that fewer samples are required with projection acquisition as one approaches the center of k-space.

DESCRIPTION OF THE PREFERRED EMBODIMENT

Figure 1:
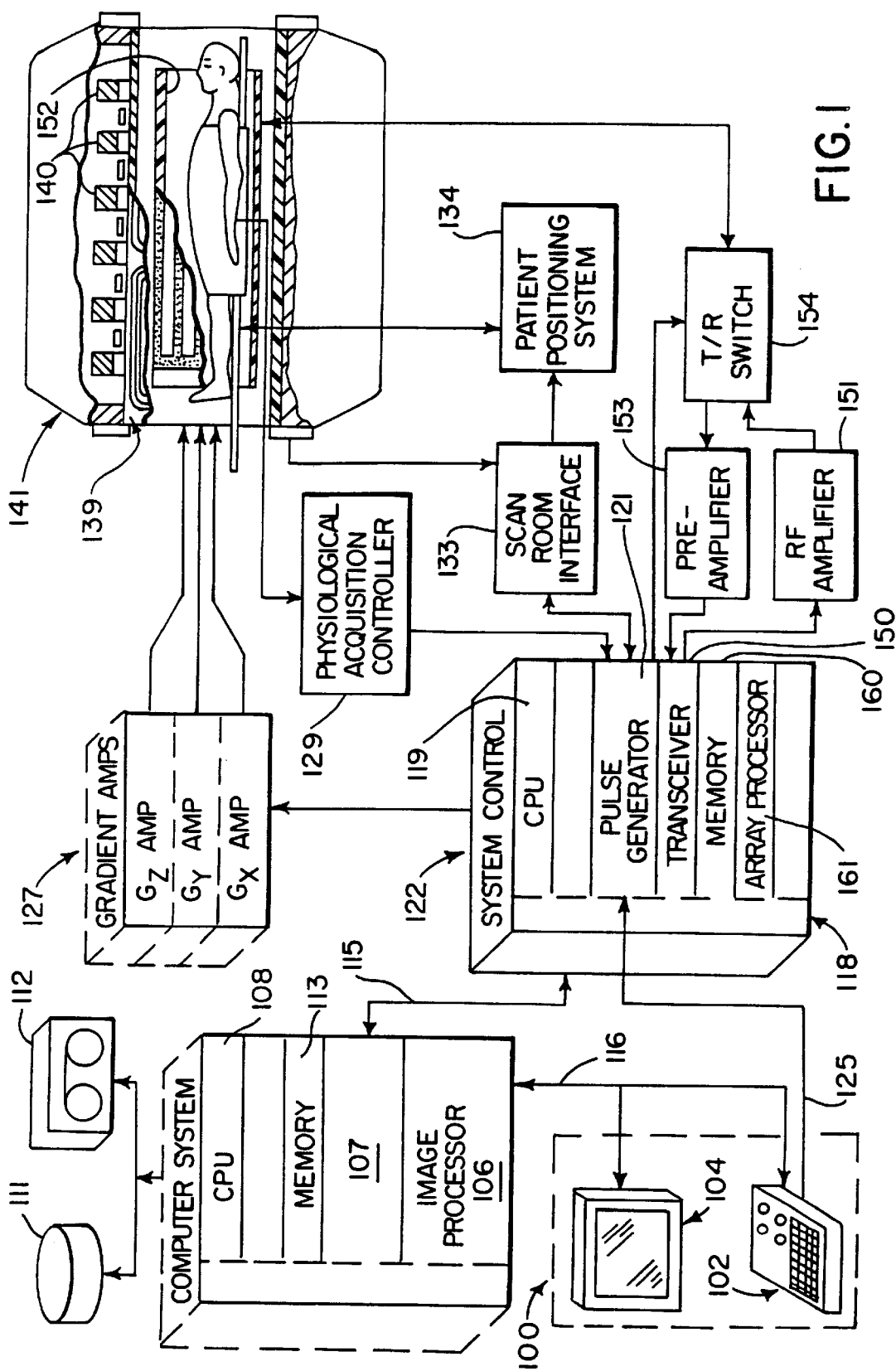
FIG. 1 is a block diagram of an MRI system which employs the present invention.
Figure 2:
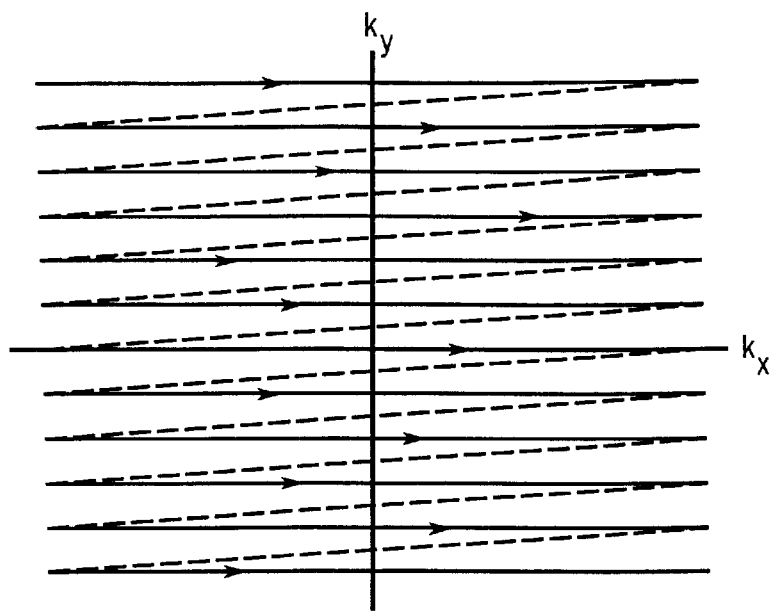
FIG. 2 is a graphic illustration of the manner in which k-space is sampled during a typical Fourier, or spin-warp, image acquisition using the MRI system of FIG. 1.
Figure 3:
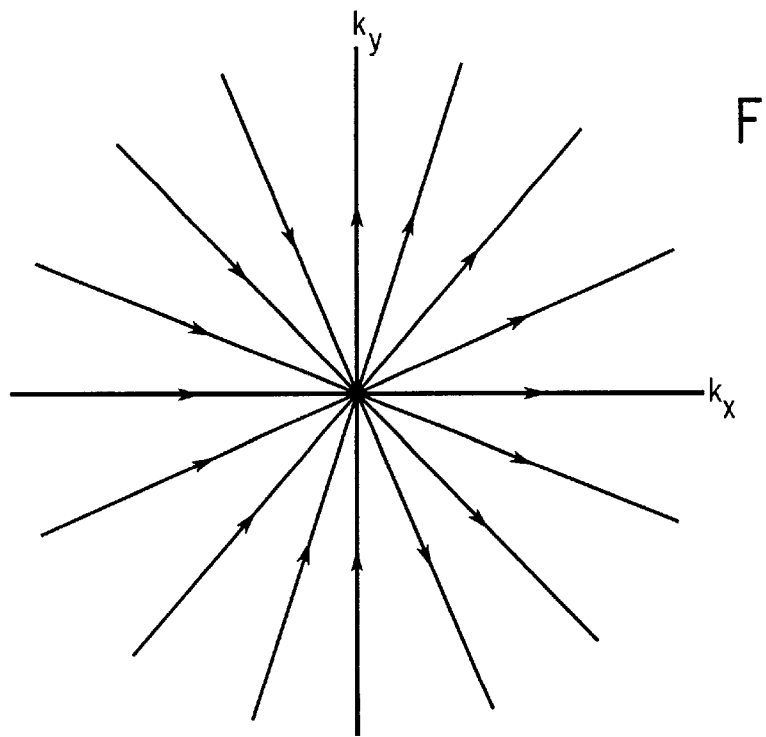
FIG. 3 is a graphic illustration of the manner in which k-space is sampled during a typical 2D projection reconstruction image acquisition using the MRI system of FIG. 1.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113 for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan.

The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system.

It is also through the scan room interface circuit 133 that a patient positioning system 134 receives commands from the pulse generator module 121 to move the patient through the scanner to perform the scan in accordance with the present invention. The current position of the table at any time during the scan is read into the system control 122 and used to phase correct the acquired NMR data as will be described in more detail below. The operator can control the operation of the patient positioning system 134 through the keyboard and control panel 102.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 8:
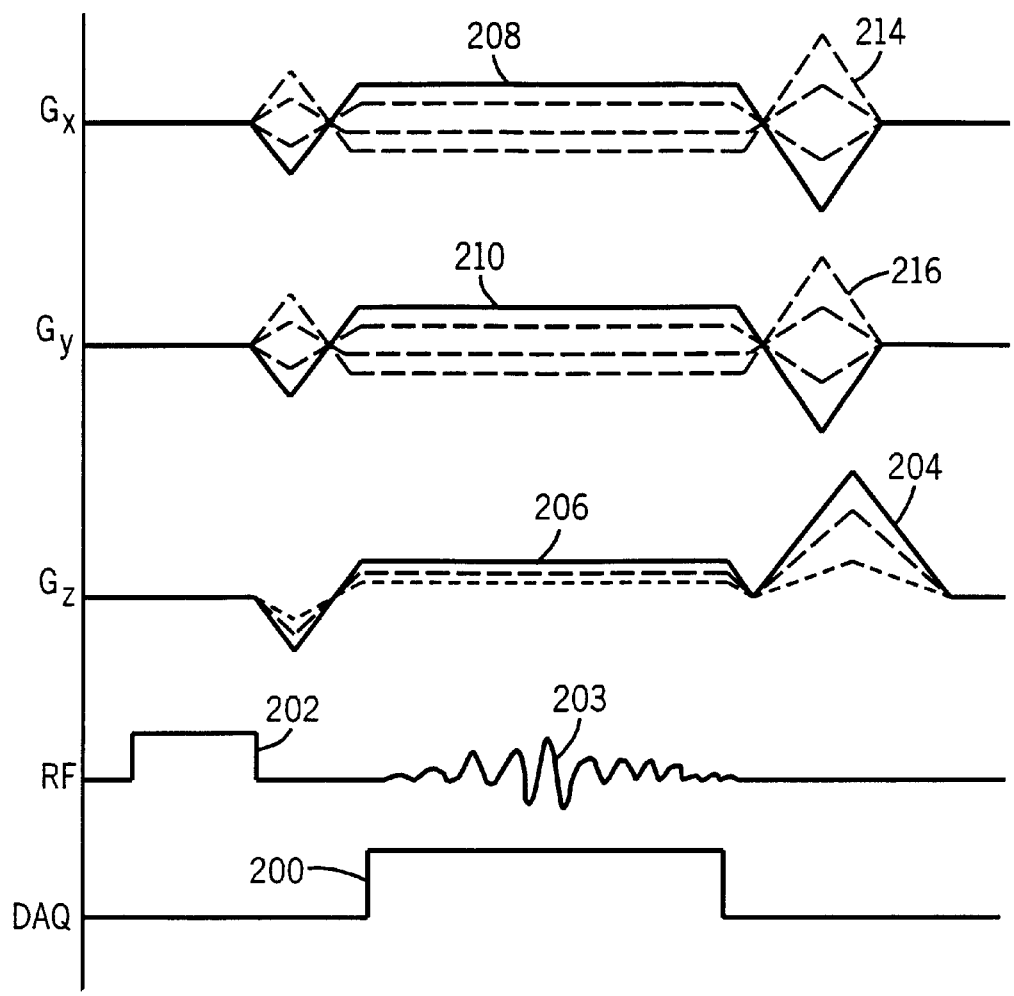
FIG. 8 is a graphic representation of the preferred 3D projection reconstruction pulse sequence used to practice the preferred embodiment of the invention.

A pulse sequence used to acquire data as 3D projections is shown in FIG. 8. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. If partial echo is chosen, the bottom half of k-space (k<0) is only partially acquired. Because of the large FOV in all directions, a non-selective 200 µs radio-frequency (RF) pulse 202 can be used to produce transverse magnetization throughout the MRI system FOV. Relative to slab-selective excitation, this scheme provides a more uniform flip angle across the volume, requires lower RF power, and deposits less energy into the patient.

A gradient-recalled NMR echo signal 203 is produced by spins in the excited FOV and acquired in the presence of three readout gradients 206, 208 and 210. Since a slab-select gradient is not required, the readout gradient waveforms $G_x$, $G_y$, and $G_z$, have a similar form. This symmetry is interrupted only by the need to spoil the sequence, which is accomplished by playing a dephasing gradient lobe 204. The area of the dephasing lobe 204 is calculated to satisfy the condition $$\int_0^{T_R} (G_{dephase}(t) + G_{read}(t)) dt = n \cdot k_{max} \tag{4}$$

where n is an integer $n \geq 2$. Because the $G_z$ readout gradient 206 is always positive on the logical z-axis, the time required for the spoiling gradient 204 is minimized by playing the dephasing lobe 204 only on $G_z$. The $G_x$ and $G_y$ readout gradients 208 and 210 are rewound by respective gradient pulses 212 and 214 to achieve steady state.

The readout gradient waveforms $G_x$, $G_y$ and $G_z$ are modulated during the scan to sample radial trajectories at different θ and φ angles. As described in co-pending U.S. patent application Ser. No. 09/767,757, filed on Jan. 23, 2001 and entitled "Magnetic Resonance Angiography Using Undersampled 3D Projection Imaging," the angular spacing of θ and φ are chosen such that a uniform distribution of k-space sample points occurs at the peripheral boundary ($k_{max}$) of the sampled k-space sphere. Although several methods of calculating the distribution are known, a method which evenly distributes the projections by sampling the spherical surface with a spiral trajectory, with the conditions of constant path velocity and surface area coverage is used. This solution also has the benefit of generating a continuous sample path, which reduces gradient switching and eddy currents. For N total projections, the equations for the gradient amplitude as a function of projection view number n are:

$$G_z = \frac{2n-1}{2N} \tag{5}$$

$$G_x = \cos(\sqrt{2N\pi}\sin^{-1}G_z(n))\sqrt{1-G_{z(n)}^2} \tag{6}$$

$$G_y = \sin(\sqrt{2N\pi}\sin^{-1}G_z(n))\sqrt{1-G_{z(n)}^2} \tag{7}$$

If a fully sampled image acquisition is to be performed, N is set to a value $N_p$, which satisfies the Nyquist condition, and a series of $N=N_p$ pulse sequences are performed. The readout gradient amplitudes for the $n^{th}$ pulse sequence in this series is given by equations (5), (6) and (7). While n can be indexed from 1 to N in monotonic order during the scan, it can be appreciated that other orders are possible. In the preferred embodiment the series of N sequences is repeated a number of times as the patient is moved through the scanner FOV until the entire prescribed FOV is acquired.

Each section of N projection views may be reconstructed into an image of a corresponding subregion of the subject. The subregion images are then concatenated to form a single image that covers the entire prescribed FOV. In this embodiment the table location when the first projection view in each section is acquired is used as a reference position and all N views of the section are phase corrected using Equation (1) as described above to correct for the table motion.

In the preferred image reconstruction method, a regridding method is used to place the phase corrected data set on a 3D Cartesian grid. Such regridding methods are well known in the art and is described, for example, in J. Jackson et al, "Selection Of Convolution Function For Fourier Inversion Using Gridding," *IEEE Trans. Med. Imaging*, 10, 473–478, 1991. The resulting 3D array of k-space data are density compensated with a $\rho^2$ filter, where $\sigma$ is the k-space radius of the data point being compensated. The $\rho=0$ point is weighted according to the finite sphere of volume that it samples, similar to the correction proposed for 2D projection filters. The kernel used for the regridding process is either a simple triangle function, which is computationally very fast, or a Kaiser-Bessel function, which has the advantage of reducing aliased energy from the regridding process.

The regridded k-space data is then Fourier-transformed in all three directions into image space. If a partial echo was used for the acquisition, the missing data is synthesized with a 3D homodyne process such as that described by Noll and Nishimura, "Homodyne Detection In Magnetic Resonance Imaging," *IEEE Transactions on Medical Imaging*, Vol. 10, No. 2, June 1991 and in U.S. Pat. No. 5,243,284. The final images are divided by the Fourier transform of the convolution kernel to correct for low-frequency image intensity variations due to the regridding process.

It should be apparent to those skilled in the art that sampling trajectories other than the preferred straight line trajectory extending from one point on the k-space peripheral boundary, through the center of k-space to an opposite point on the k-space peripheral boundary may be used. As mentioned above, one variation is to acquire a partial NMR echo signal 203 which samples along a trajectory that does not extend across the entire extent of the sampled k-space volume. The missing samples are synthesized during the homodyne reconstruction described above. Another variation which is equivalent to the straight line projection reconstruction pulse sequence is to sample along a curved path rather than a straight line. Such pulse sequences are described, for example, in "Fast Three Dimensional Sodium Imaging", MRM, 37:706–715, 1997 by F. E. Boada, et al.

There are also alternative methods for reconstructing a 3D image from the acquired 3D k-space image data set. One alternative is a filtered backprojection method such as that described by F. Natterer, "The Mathmatics of Computerized Tomography", Teubner, Stuttgart, 1986. This is a method commonly used to reconstruct x-ray CT images.

In the preferred embodiment the k-space data associated with each anatomic subregion is not acquired as N monotonic views, but instead as ten interleaved subsets which are acquired in succession. Each interleave includes N/10 views which sample the spherical k-space volume uniformly. For example, if the TR of the 3DPR sequence is 3 ms, then a section of N=10,000 projections requires 30 seconds to acquire and each interleave requires 3 seconds. Each interleave samples k-space differently such that the sum of all ten interleaves samples k-space uniformly with the same density as a monotonic acquisition with N views. The significant difference is that an image can be reconstructed from the N/10 views in each interleave which has a temporal resolution ten times greater than a complete section, but which has increased image artifacts and lower SNR.

Figure 9:
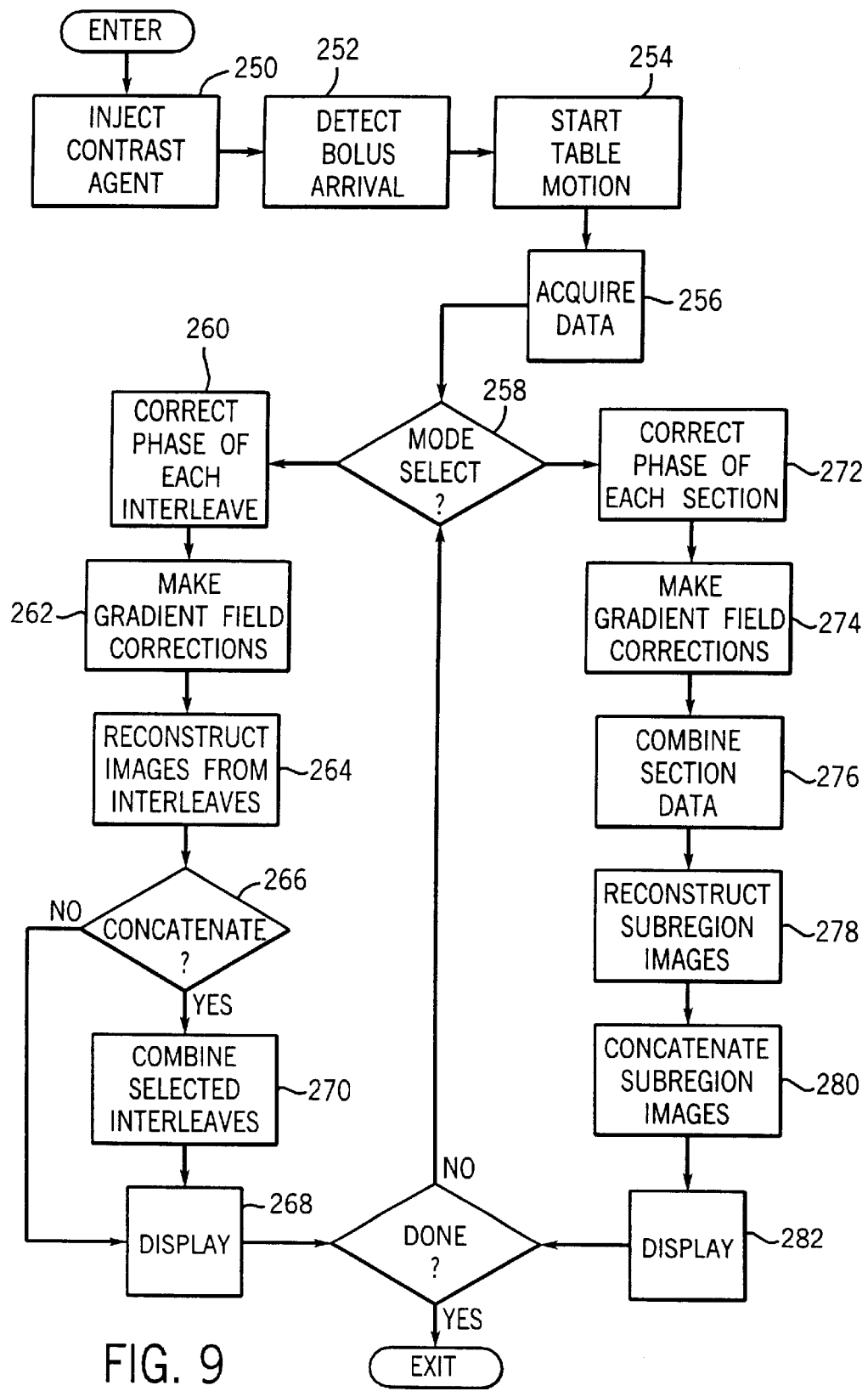
FIG. 9 is a flow chart which indicates the steps used to perform the preferred embodiment of the invention.

Referring particularly to FIG. 9, the preferred implementation of the present invention is a CEMRA of the lower extremities of a patient. The operator enters the prescribed scan, including the size of the prescribed FOV and the particulars of the 3DPR pulse sequence. Referring to FIG. 4, this prescription defines a static FOV 14 within the scanner FOV 10 and a starting table position. Referring now to FIG. 9, the attending physician is signaled to inject the contrast agent into the patient at process block 250. The MRI system performs a bolus detection pulse sequence such as that disclosed in U.S. Pat. No. 6,167,293 to continuously monitor the signal in an artery entering the prescribed FOV and indicate contrast bolus arrival as indicated at process block 252. Table motion is then started as indicated at process block 254 to move the prescribed subject FOV through the static FOV 14 at a constant velocity $V_z$. $V_z$ is determined from the prescription parameters.

For example, if the MRI system has a static FOV=20 cm and a subregion extends a distance A=5 cm along the z-axis, then the projection views must be acquired in the time needed to move the table FOV−A=20−5=15 cm. If ten interleaves are to be acquired with 1000 projection views in each interleave, then $N_p$=10,000 projection views are to be acquired during this time. With a pulse sequence TR=3 ms a complete section of k-space data is acquired in 30 seconds. The resulting table velocity V in this case is 0.5 cm/sec:

$$V=(FOV-A)/(N_p*TR).$$

As soon as table motion is initiated the prescribed 3DPR pulse sequence is executed to sample a k-space volume as described above and indicated at process block 256. A typical acquisition employs a 3DPR pulse sequence with a TR of 3 ms. Each section of k-space contains 10 interleaves, and each interleave includes 1000 projection views. Each of the ten interleaves is acquired by stepping the imaging gradients through values set forth in the above equations (5), (6) and (7), where N=10,000. Each of the ten interleaves starts at a different number from n=1 to 10 and n is incremented by ten after each projection view acquisition until 1000 projection views have been acquired. This process is repeated to acquire further sections of k-space until the entire prescribed subject FOV has been acquired.

Figure 10:
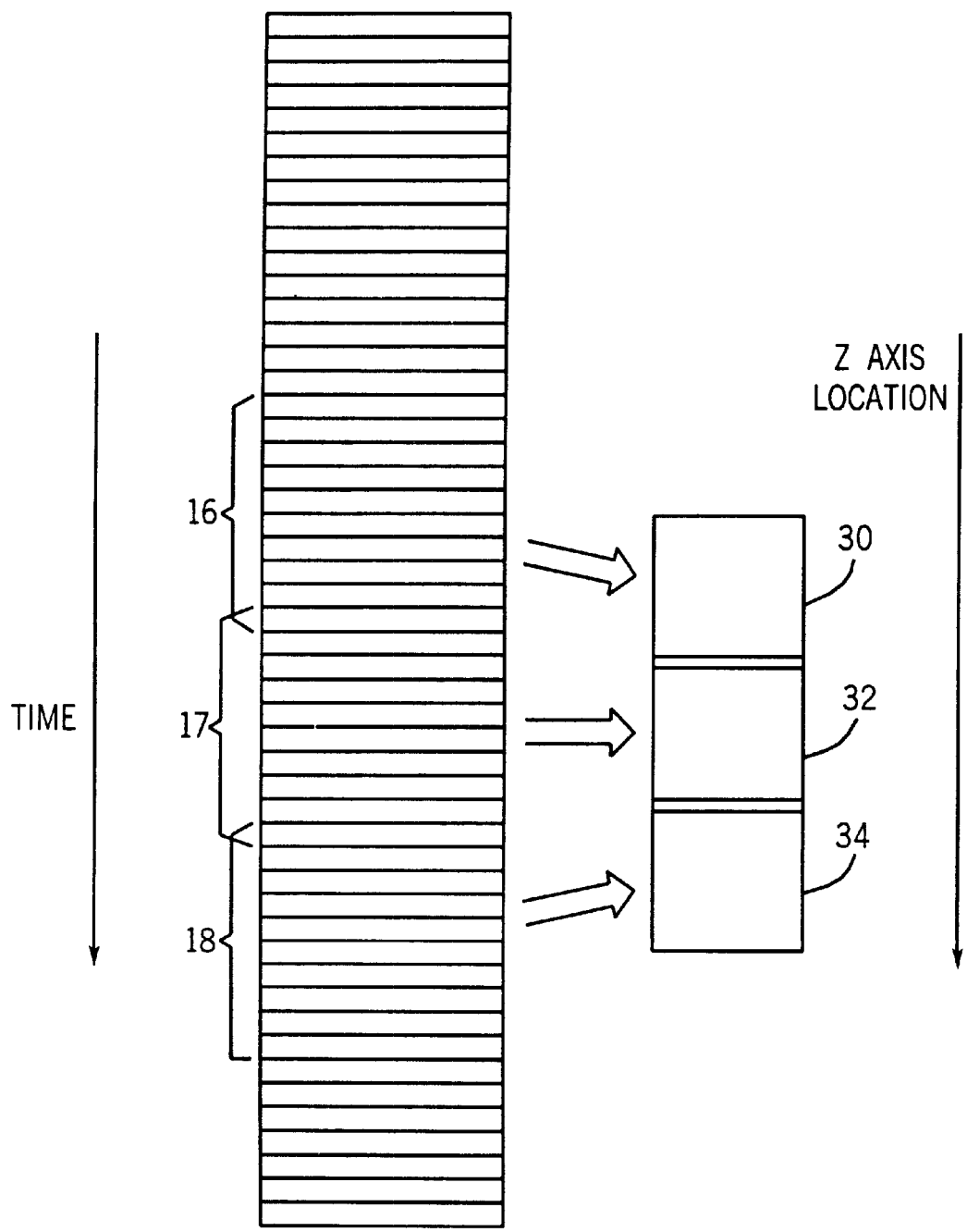
FIG. 10 is a pictorial representation of the k-space data acquired using the pulse sequence of FIG. 8.

The resulting k-space data set is illustrated in FIG. 10, where each line defines one interleave set of acquired k-space data. As shown at 16, the k-space data for any chosen anatomic subregion is formed by combining the k-space data from ten successive interleaves. To reconstruct two adjacent anatomic subregions some of the same acquired k-space data may be required in both reconstructions. As a result, the k-space sections 16, 17 ad 18 overlap.

A number of clinically useful images can be reconstructed from this acquired k-space data set as determined at mode select decision block 258. In an "interleave reconstruction" mode, subregion images are reconstructed from each 1000 view interleave, and in a "section reconstruction" mode, subregion images are reconstructed from data in an entire k-space section of ten successive interleaves.

As indicated at process block 260, when the interleave mode is selected, each interleave is phase corrected for table motion. This is performed as described above using equation (1), where the position of the last projection view in the interleave is used as the reference position for that interleave. As indicated by process block 262, prior to image reconstruction further phase corrections are made to offset errors caused by non-linearities in the imaging gradient fields. This is accomplished by performing a one dimensional Fourier transformation of each projection view to obtain the spatial distribution of spin signals along the projection readout gradient axis. The spatial distribution is corrected for gradient non-linearities along this readout axis using a method such as that described in U.S. Pat. No. 4,591,789 entitled "Method For Correcting Image Distortion Due To Gradient Nonuniformity". The redistributed data is then Fourier transformed back to k-space.

As indicated at process block 264, the corrected k-space data for each interleave is then processed to reconstruct an image of its corresponding subregion. This is accomplished as described above by first regridding the projection data and then performing a three-dimensional Fourier transformation. Since structures outside the subregion may be reconstructed with an incomplete set of projection data, an additional masking step is employed to limit the image to the anatomic subregion.

As a result, a set of ten interleave images are reconstructed from each section 16 of acquired k-space data as the associated anatomic subregion traverses through the MRI system FOV. Each interleave image depicts the contrast enhancement in the corresponding subregion of the subject at successive 3 second time intervals. Typically, the contrast enhancement in one interleave image for a particular subregion will be better from a clinical standpoint since it captures the inflow of contrast agent at the optimal moment.

As determined at decision block 266, the physician may elect to display some or all of the interleave images as indicated at process block 268, or the physician may elect to first concatenate selected interleave images from successive anatomic subregions as indicated at process block 270. In the latter case the physician typically selects the best interleave image (from a clinical standpoint) for each subregion and the successive subregions are concatenated to form one large image of the entire prescribed FOV. Referring to FIG. 10, to assist in this concatenation process it is preferable to overlap successive sections of k-space data as shown by sections 16, 17 and 18. The corresponding subregion images 30, 32 and 34 that are reconstructed also overlap, and the common anatomic structures in the overlap regions can be used to register successive subregions with each other.

The interleave reconstruction mode enables the physician to see a dynamic study of the contrast enhancement of each subregion as it passes through the MRI system FOV and to identify the optimally timed interleave in each k-space section. However, the interleave images are limited in quality because they are reconstructed from only 1000 projections views.

Referring again to FIG. 9, if the section reconstruction mode is selected at decision block 258, higher quality images may be produced. Typically, this mode is entered after the optimal interleave in each section of k-space data has been identified as described above. As a result, the phase correction of each section of acquired k-space data (e.g., 16, 17 and 18 in FIG. 10) for table motion is referenced to a table position during the optimal interleave as indicated at process block 272. All of the projection view samples in all the interleaves in a section are phase corrected according to equation (1) to the reference table position in the selected interleave. If no interleave has been selected, the reference table position is that of the last projection view in the last interleave of the section.

The k-space data is further corrected for gradient field non-linearities at process block 274 and then the corrected interleave data in each section is combined at process block 276. The gradient field phase corrections are the same as described above and the data combination step depends on whether optimal interleaves have been selected. When no interleave has been selected, the corrected k-space data for all ten interleaves is simply combined into a single 3D k-space array containing 10,000 different sample trajectories. All the sample trajectories are weighted equally so that the temporal resolution is spread over the 30 second time interval needed to acquire the entire section.

Figure 7:
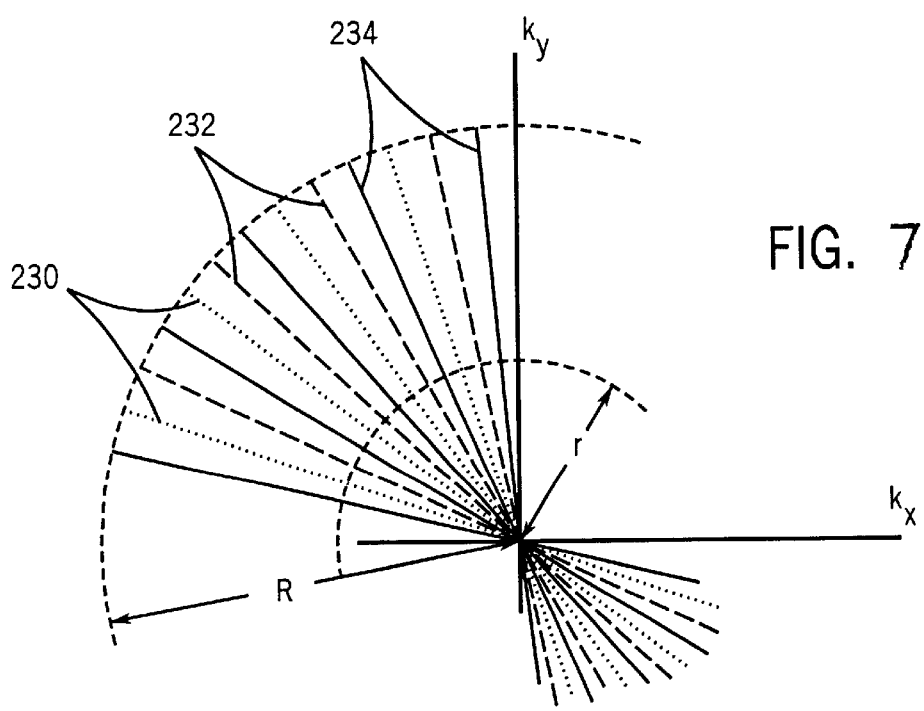
FIG. 7 is a pictorial representation of interleaved sampling of k-space.
Figure 11:
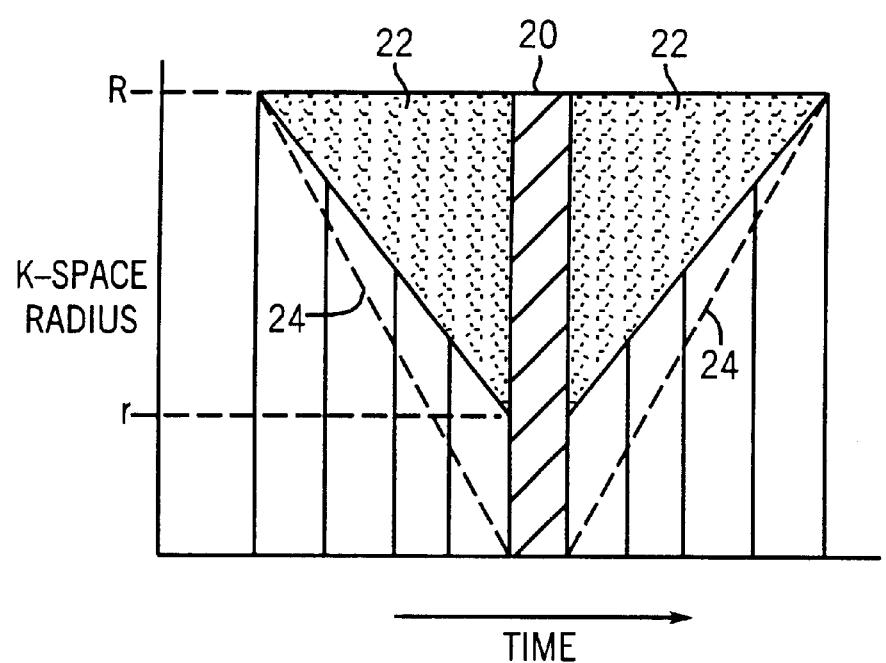
FIG. 11 is a pictorial representation of the method used to combine interleave data in a step performed in the method of FIG. 9.

If optimal interleaves have been identified for each section, the combination of section data is done differently. As shown in FIG. 11, all of the corrected k-space data from the selected interleave 20 is included in the combined k-space data set, but little or no central k-space data is used from surrounding interleaves in the same section. In one embodiment no central k-space data is combined from surrounding interleaves out to a k-space radius r discussed above with reference to FIG. 7. From the radius r outward k-space data is combined from a continuously wider time window out to the periphery of k-space at radius R. This peripheral k-space data indicated at 22 reduces image artifacts and increases image SNR without significantly reducing the three second time resolution of the image. In yet another preferred embodiment the SNR of the image is further improved by combining a limited amount of central k-space data with that from the selected interleave 20 as indicated in FIG. 11 by dashed lines 24. This embodiment reduces the time resolution of the reconstructed image by widening the time window progressively from 3 seconds starting at the center of k-space rather than the radius r, but it combines more k-space samples which results in a higher image SNR.

Referring again to FIG. 9, a subregion image is reconstructed at process block 278 using the combined section k-space data. As described above, the reconstruction is performed by regridding the k-space data and then performing a three-dimensional Fourier transformation. Structures outside the corresponding subregion are masked out of the resulting subregion image. As indicated at process block 280, the successive subregion images are then concatenated together and displayed at 282 as a single image that encompasses the entire prescribed subject field of view.

While the use of a 3DPR pulse sequence is preferred, other projection reconstruction pulse sequences may also be used. For example a hybrid PR sequence such as that described by Vigen K K, Peters D C, Grist T M, Block W F, Mistretta C A "Undersampled Projection Reconstruction Imaging For Time-Resolved Contrast-Enhanced Imaging," *Magn. Reson. Med.* 2000; 43:170–176, may be employed in which projections are acquired in a 2D plane and phase encoding is employed along the third axis. See also DC Peters et al "Undersampled Projection Reconstruction Applied to MR Angiography," *Magn. Reson. Med.* 43(1) 91–101 (2000). All the projections may be acquired before incrementing the phase encoding, or all the phase encodings may be acquired before rotating the projection angle. In either case, interleaves can be acquired by dividing the total number of projection acquisition angles into interleaved sets of angles as described above.

It will be apparent to those skilled in the art that a mask image may be acquired before injection of contrast agent and subtracted from the contrast enhanced images. Such mask images are acquired using the same procedure described above to produce an array of k-space data as shown in FIG. 10. Sections of this mask k-space data may be subtracted from corresponding sections of contrast-enhanced k-space data, or both the contrast-enhanced and the mask k-space data may be transformed as described above into images before the subtraction is performed.

What is claimed is:

1. A method for producing an image of a subject with a magnetic resonance imaging (MRI) system over a field of view which exceeds the static field of view of the MRI system, the steps comprising:

a) moving the subject through the static field of view of the MRI system;

b) continuously acquiring k-space data with the MRI system as step a) is performed using a projection reconstruction pulse sequence which acquires a projection view comprised of a line of k-space samples that extend outward from the center of k-space; and c) reconstructing a plurality of subregion images of the subject from sections of k-space data associated with such subregions, each of which section of associated k-space data being acquired while its associated subregion is within the static field of view of the MRI system, wherein the subregion images depict the field of view of the subject.

2. The method as recited in claim 1 which includes:
concatenating the subregion images to form a single image of the subject.

3. The method as recited in claim 1 in which the projection reconstruction pulse sequence is a three-dimensional projection reconstruction pulse sequence in which the lines of k-space samples extend outward from the center of k-space in three dimensions.

4. The method as recited in claim 1 in which the reconstruction of each subregion includes:
regridding the lines of k-space samples in its corresponding section to form a three-dimensional array of k-space samples; and
performing a three-dimensional Fourier transformation of the array of k-space samples.

5. The method as recited in claim 1 in which each section of k-space data associated with a subregion is acquired as a plurality of interleave sets of projection views and each set of interleaved projection views acquires sufficient k-space data to reconstruct an image of the associated subregion.

6. The method as recited in claim 5 in which step c) includes:
i) combining k-space data from all the sets of interleaved projection views in the section of k-space associated with a subregion; and
ii) reconstructing a subregion image from the combined k-space data.

7. The method as recited in claim 6 in which step i) is performed by:
selecting one of the sets of interleaved projection views;
combining all of the k-space data acquired by the selected one set of interleaved projection views; and
combining peripheral k-space data from other ones of the sets of interleaved projection views in the section of k-space associated with a subregion.

8. The method as recited in claim 7 in which the amount of peripheral k-space data acquired by each of the other ones of the sets of interleaved projection views that is combined with the k-space data acquired by the selected one set of interleaved projection views varies as a function of its temporal proximity to the selected one set of interleaved projection views.

9. The method as recited in claim 1 in which step c) includes:
phase correcting the k-space data acquired in step b) to offset the effect of moving the subject during the data acquisition.

10. The method as recited in claim 1 which includes:
i) storing data indicative of the subject location along an axis of motion as each projection view is acquired;
ii) establishing a subject reference location for each subregion image to be reconstructed; and
iii) phase correcting the k-space data employed to reconstruct each subregion image using the subject reference location for the subregion and the stored data indicative of subject location at the time the k-space data was acquired.

11. The method as recited in claim 10 in which the phase correction in step iii) is:

$$S_z(t_R)=S_{z+\Delta z}(t_R)exp(-ik_z\Delta z);$$

where:
$S_z(t_R)$=corrected k-space data;
$S_{z+\Delta z}(t_R)$=k-space data acquired while subject located a distance $\Delta z$ along said axis of motion from the subject reference location;
$K_z=-\gamma G_z t_R$;
$\Delta z$=distance between k-space data acquisition location of subject and subject reference location;
$G_z$=magnetic field gradient along said axis of motion; and
$t_R$=time during signal readout.

12. A method for producing an image of a subject with a magnetic resonance imaging (MRI) system over a field of view which exceeds the static field of view of the MRI system, the steps comprising:

a) moving the subject through the static field of view of the MRI system;
b) continuously acquiring k-space data with the MRI system as step a) is performed using a projection reconstruction pulse sequence which acquires a projection view comprised of a line of k-space samples that extend outward from the center of k-space;
c) storing data indicative of the subject location along an axis of motion as each projection view is acquired;
d) establishing a subject reference location;
e) phase correcting the acquired k-space data using the subject reference location and the stored data indicative of subject location at the time the k-space data was acquired; and
f) reconstructing the image using the phase corrected k-space data.

13. The method as recited in claim 12 in which the phase correction in step iii) is:

$$S_z(t_R)=S_{z+\Delta z}(t_R)exp(-ik_z\Delta z)$$

where:
$S_z(t_R)$=corrected k-space data;
$S_{z+\Delta z}(t_R)$=k-space data acquired while subject located a distance $\Delta z$ along said axis of motion from the subject reference location;
$K_z=-\gamma G_z t_R$;
$\Delta z$=distance between k-space data acquisition location of subject and subject reference location;
$G_z$=magnetic field gradient along said axis of motion; and
$t_R$=time during signal readout.

14. The method as recited in claim 12 which includes:
i) grouping the k-space data acquired in step b) into a plurality of groups of acquired k-space data corresponding to a plurality of anatomic subregions;
ii) establishing a subject reference location for each group of acquired k-space data;
iii) phase correcting the acquired k-space data in each group using the subject reference location for that group.

15. The method as recited in claim 14 in which step e) is performed by
iv) reconstructing subregion images from phase corrected k-space data in corresponding groups; and
v) concatenating the subregion images.

16. The method as recited in claim 12 in which step f) includes:
   i) regridding the lines of k-space samples to form a three-dimensional array of k-space samples; and
   ii) performing a three-dimensional Fourier transformation of the array of k-space samples.

17. The method as recited in claim 12 which includes:
   g) injecting a contrast agent into the subject;
   h) repeating steps a) through f) to produce a contrast-enhanced image; and
   i) subtracting the image from the contrast enhanced image.

18. The method as recited in claim 12 in which step b) is performed by acquiring a series of interleaved sets of projection views as a subregion in the subject is moved through the static field of view of the MRI system.

19. The method as recited in claim 18 which includes reconstructing an image from each interleaved set of projection views.

20. The method as recited in claim 19 which includes:
   injecting a contrast agent into the subject prior to performing step a).

* * * * *

UNITED STATES PATENT AND TRADEMARK OFFICE
CERTIFICATE OF CORRECTION

PATENT NO. : 6,671,536 B2
DATED : December 30, 2003
INVENTOR(S) : Charles A. Mistretta It is certified that error appears in the above-identified patent and that said Letters Patent is hereby corrected as shown below:

Column 1,
Line 4, add the following paragraph as the first paragraph:
-- Statement Regarding Federally Sponsored Research
   This invention was made with government support under Grant No. NIH HL62425 awarded by the National Institute of Health. The United States Government has certain rights in this invention. --

Signed and Sealed this

Twentieth Day of April, 2004

JON W. DUDAS
*Acting Director of the United States Patent and Trademark Office*